(12) United States Patent
Yen

(10) Patent No.: US 6,907,486 B1
(45) Date of Patent: Jun. 14, 2005

(54) DISK MODULE OF SOLID STATE

(75) Inventor: George Yen, Taipei (TW)

(73) Assignee: Power Quotient International Co, Ltd., Taipei Hsien (TW)

( * ) Notice: Subject to any disclaimer, the term of this patent is extended or adjusted under 35 U.S.C. 154(b) by 280 days.

(21) Appl. No.: 09/679,544

(22) Filed: Oct. 6, 2000

Related U.S. Application Data

(63) Continuation-in-part of application No. 09/236,398, filed on Jan. 25, 1999, now Pat. No. 6,378,015.

(51) Int. Cl.[7] .............................. G06F 13/00; G06F 1/16
(52) U.S. Cl. ...................................... 710/300; 361/685
(58) Field of Search ................................ 710/100, 305, 710/300, 301; 361/685

(56) References Cited

U.S. PATENT DOCUMENTS

| | | | | |
|---|---|---|---|---|
| 5,446,877 A | * | 8/1995 | Liu et al. .................... | 710/100 |
| 5,545,583 A | * | 8/1996 | Lam et al. .................... | 437/52 |
| 5,860,113 A | * | 1/1999 | Tung ........................... | 711/144 |
| 6,182,162 B1 | * | 1/2001 | Estakhri et al. ............... | 710/11 |
| 6,199,122 B1 | * | 3/2001 | Kobayashi ................... | 710/36 |
| 6,263,440 B1 | * | 7/2001 | Pruett et al. ................ | 713/200 |

* cited by examiner

*Primary Examiner*—Tim Vo
(74) *Attorney, Agent, or Firm*—Troxell Law Office, PLLC

(57) ABSTRACT

A disk module of solid state is comprised of a IDE interface, a flash memory controller, a power source, and a flash memory array. The IDE interface is a connector to engage with the main board of a computer. The flash memory controller is used to control data access and specify an address of data storage. The power source is connected to the flash memory controller for supplying a working voltage. A flash memory array is composed of a plurality of flash memories and connecting with the flash memory controller for saving data.

5 Claims, 6 Drawing Sheets

DISK MODULE OF SOLID STATE

This application is a Continuation-In-Part of application Ser. No. 09/236,398 entitled "Disk On Module" filed on Jan. 25, 1999, now U.S. Pat. No. 6,378,015.

BACKGROUND OF THE INVENTION

1. Field of the Invention

The present invention relates to a disk module of solid state, and particularly to a disk module made of flash memory by way of a solid state process.

2. Description of Related Art

Conventionally, the memory used in a computer is a memory module made of dynamic random access memories (DRAM). A specific feature of the DRAM is that the data stored in the DRAM will disappear completely as long as the power source is off. Hence, the DRAM can merely offer a temporary storage for data and a hard disk is often applied as a storage device once the data has to be saved after the power source is off. Thus, the hard disk becomes one of typical peripheries of a personal computer.

As a data storage device, the hard disk comprises a magnetic disk set of high rotation speed bearing data thereon and a plurality of magnetic heads reading the data on the magnetic disk set. Because it is difficult to prevent the hard disk from a vibration effect, a bottleneck of the hard disk is the portability thereof. Besides, there is no standardized design specification for the hard disk such that it is very difficult to design a push-pull type of hard disk.

Moreover, a recent development of the hard disk aims at a high storage capacity and results in a hard disk of low storage capacity being produced less gradually. But, it is conceivable that a low storage capacity is enough for certain specific applications so that a hard disk of high storage capacity is not proper and is excessive.

As for flash memory, it offers a feature that the data saved therein can be kept not removed at the time of power source being off. Thus, a module of flash memory is produced instead of that of DRAM in case of the data being necessary in a state of saving all the way. Accordingly, the flash memory is another choice of data storage.

At present, a module of flash memory is used to support ISA interface standard, but it is not compatible with IDE interface hard disk. Therefore, it is unable for the flash memory to substitute the hard disk such that the module of flash memory is specially made to support IDE interface for specific purposes other than hard disk. Hence, it is the reason why the popularity of the module of flash memory is quite limited till now.

SUMMARY OF THE INVENTION

An object of the present invention is to provide a disk module of solid state, which is a module of flash memory by way of solid state process associated with a standardized IDE interface slot, such that data can be stored therein in spite of power source being off.

BRIEF DESCRIPTION OF THE DRAWINGS

The present invention can be more fully understood by referring to the following description and accompanying drawing, in which.

DETAILED DESCRIPTION OF THE PREFERRED EMBODIMENTS

Figure 1:
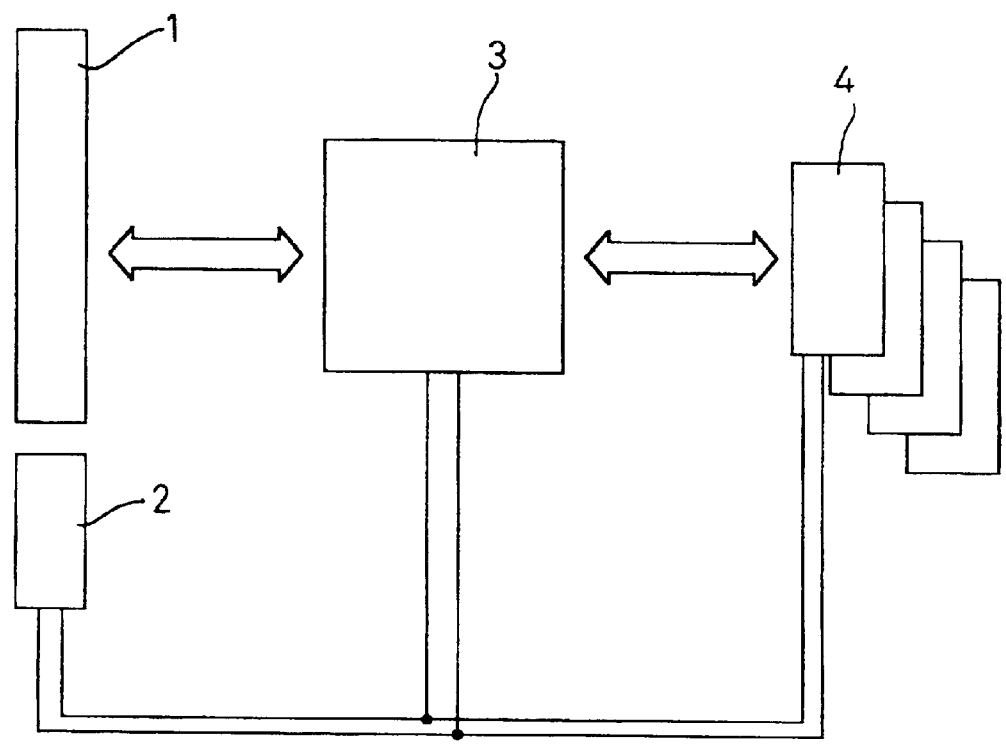
FIG. 1 is a plan view of a solid state disk module in accordance with the present invention.

Referring to FIG. 1, basically, a disk module of solid state according to the present invention comprises a IDE interface 1, a power source 2, a flash memory controller 3, and a flash memory array 4.

The IDE interface 1 is a connector provided with engaging pins and the number of the engaging pins can be variable for engaging with a disk interface on a computer. For instance, the IDE interface 1 may be adopted a standard connector normally used in computer industry such as forty connecting pins or forty-four pins. When a IDE interface of forty-four pins is applied, the power source 2 can be connected with four pins therein directly and it is not required an external connector for the power source. The IDE interface 1 is located at a side of a casing of solid state disk module B.

The power source 2 offers working voltage required by the flash memory controller 3 and the flash memory array 4. As mentioned above, four connecting pins in the IDE interface of forty-four pins are used to connect with the power source 2. However, external connector pins have to be provided additionally to connect with the power source 2 in case of the IDE interface of forty pins being adopted as sown in FIGS. 4, 5, and 6.

Figure 2:
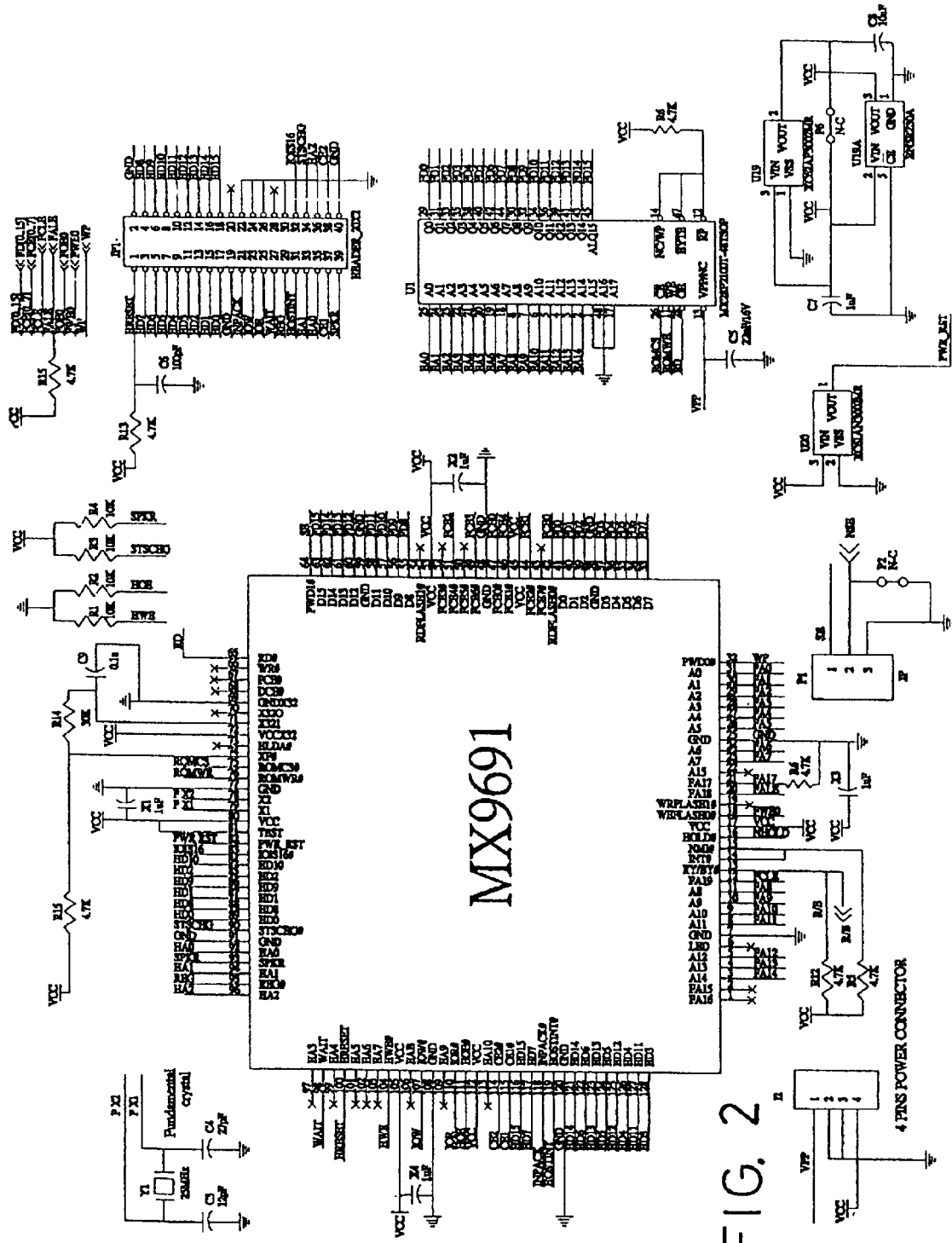
FIG. 2 is a circuit diagram of a flash memory controller and a IDE interface in an embodiment of the present invention.

The flash memory controller 3 is preferably a single chip controller to control data access and to specify an address for data storage. Therefore, the flash memory controller 3 has a circuit to connect with IDE interface 1. In practice, MX9691 single chip controller as shown in FIG. 2 can be applied as the flash memory controller 3 and this is an prior art such that there is no further detail will be described here.

Figure 3:
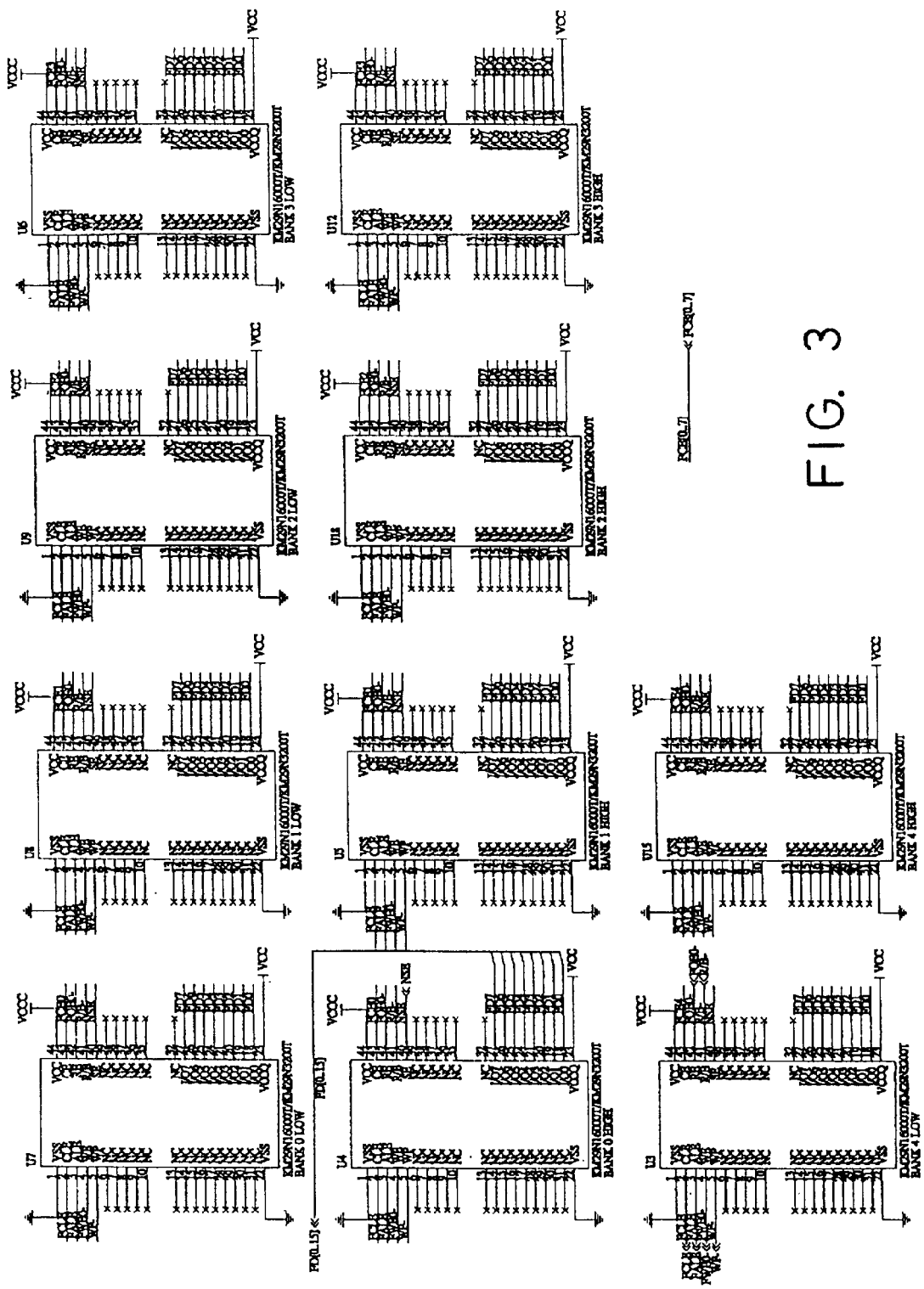
FIG. 3 is a circuit diagram of a flash memory array.

The flash memory array 4 is composed of banks of flash memories and is used for saving data. As shown in FIG. 3, ten flash memories are divided into five banks (bank 0 to bank 4). It is noted that FIG. 3 is an example only not a restriction. The flash memory array 4 also has a circuit to connect with the flash memory controller 3. In this way, a memory module is formed. It is noted that this is a prior art and a further detail will not be described.

Figure 4:
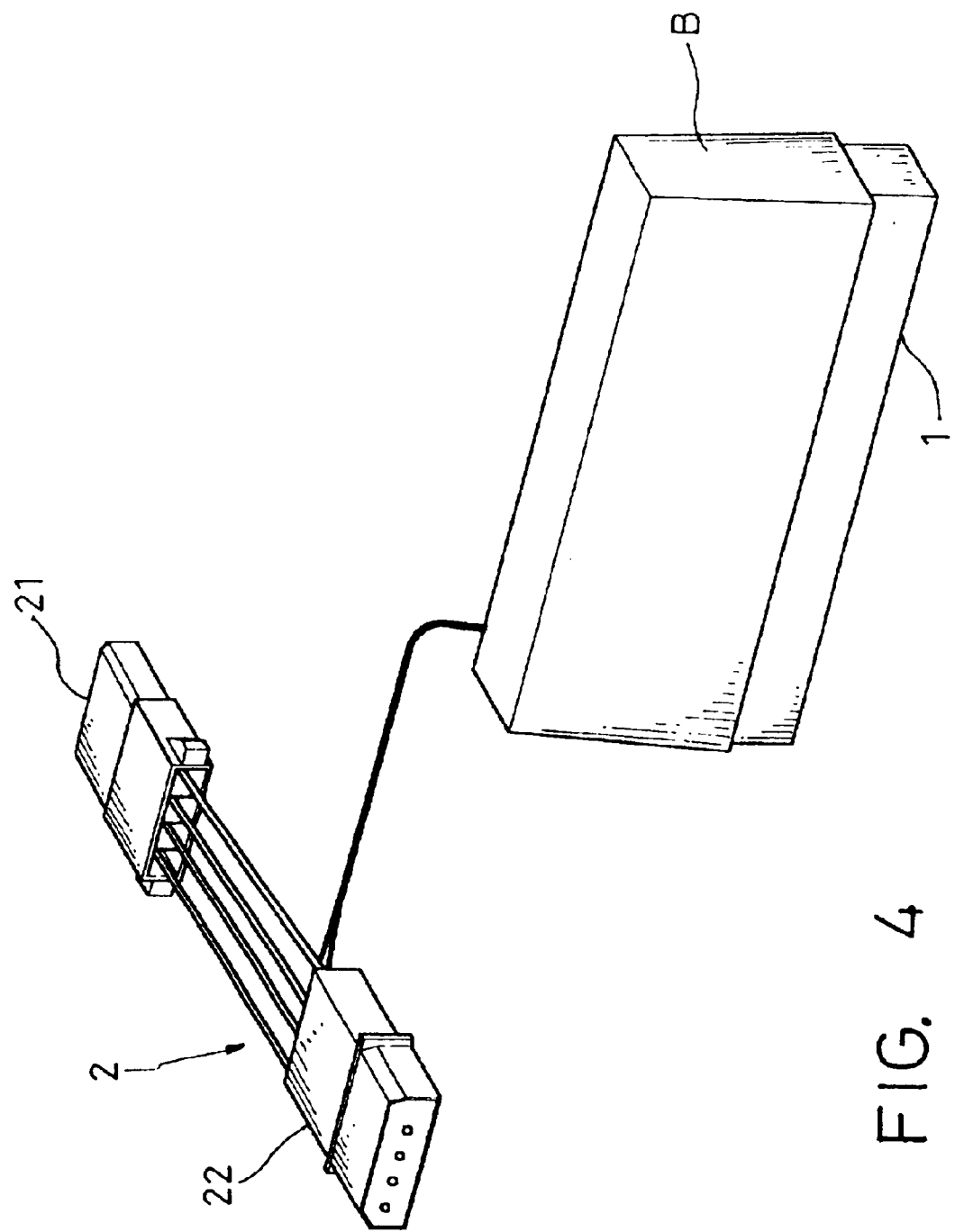
FIG. 4 is a perspective view illustrating the solid state disk module of the present invention in a state of vertical engagement.
Figure 5:
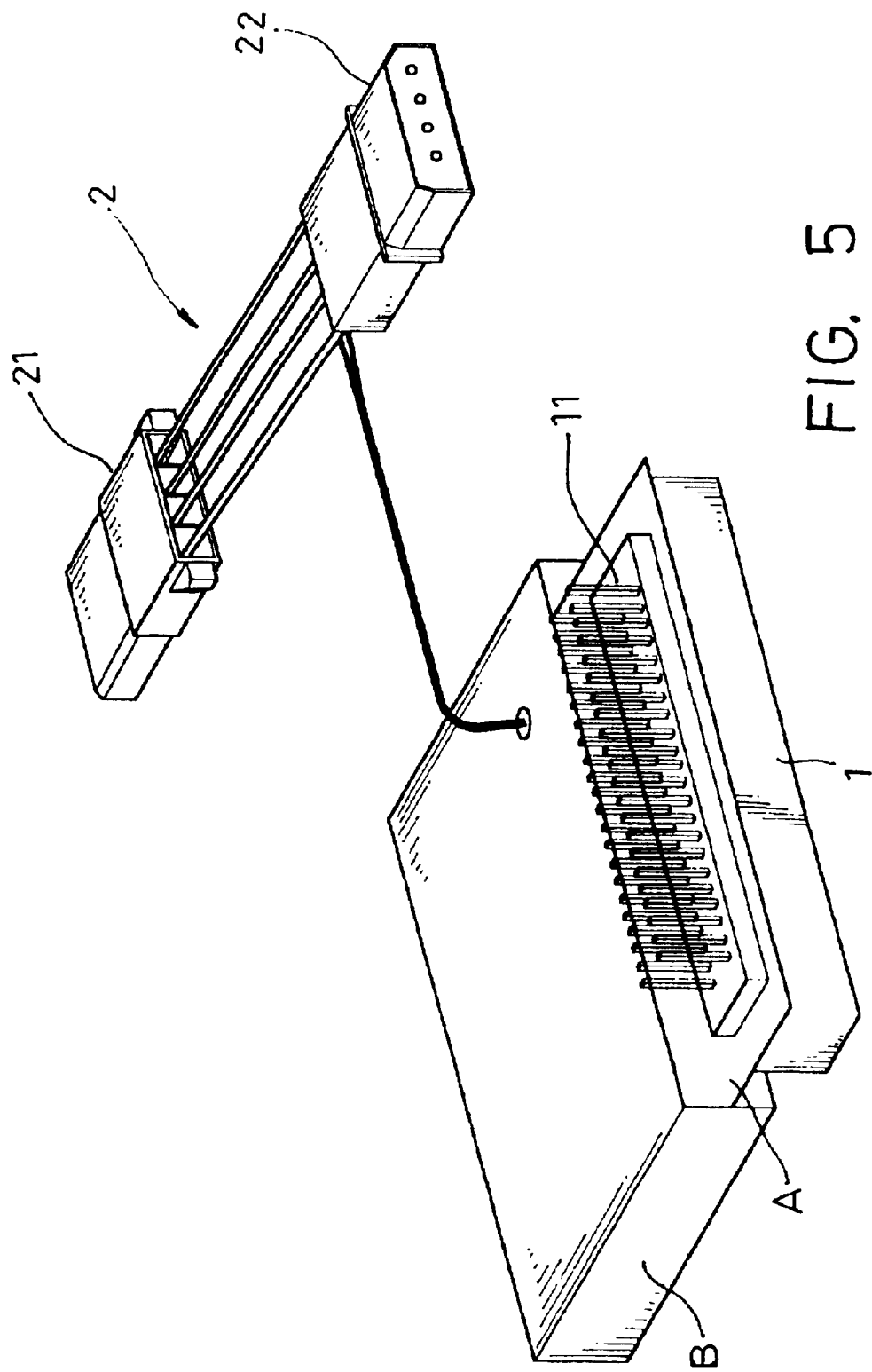
FIG. 5 is a perspective view illustrating the solid state disk module of the present invention in a state of horizontal engagement at left.
Figure 6:
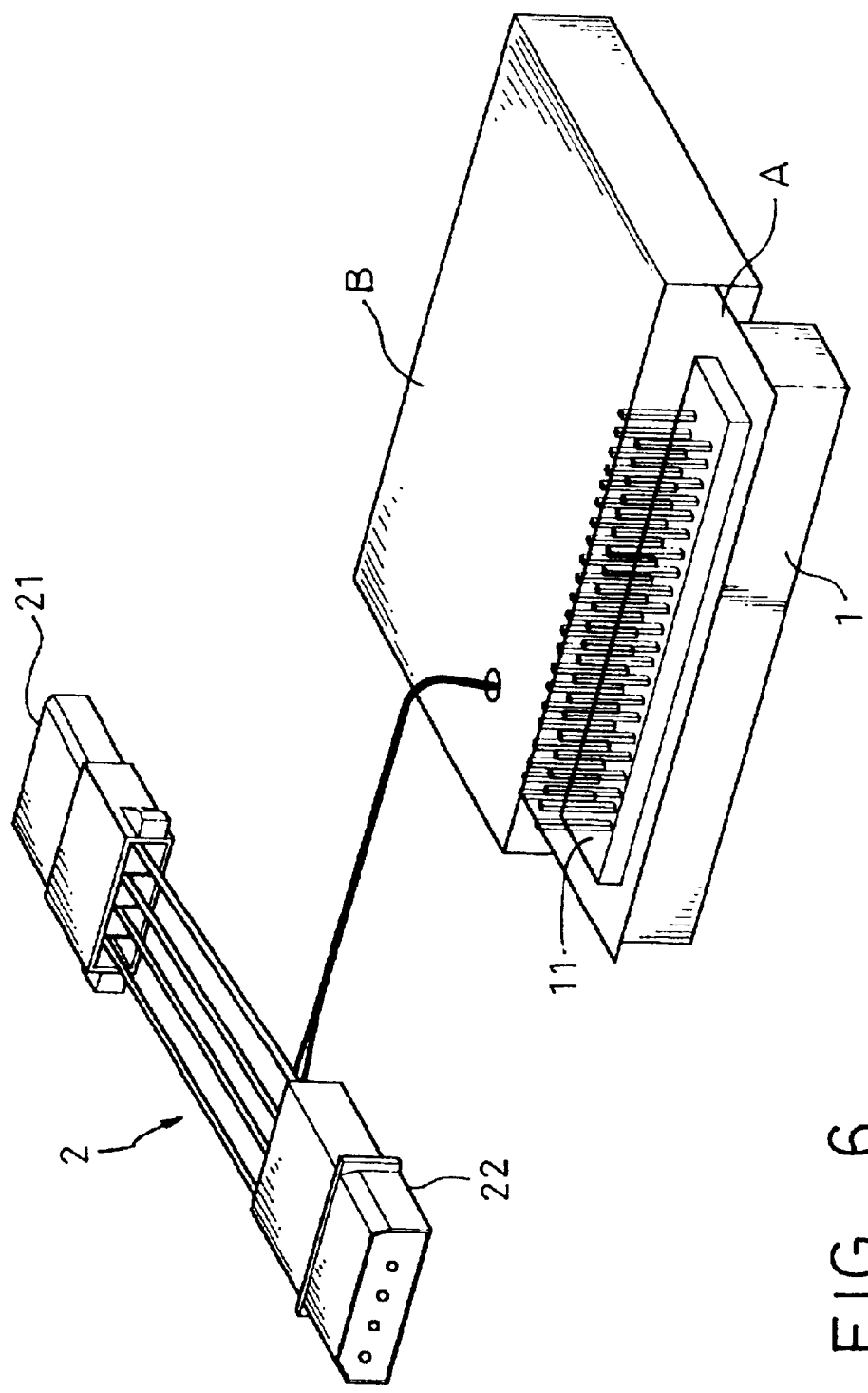
FIG. 6 is a perspective view illustrating the solid state disk module of the present invention in a state of horizontal engagement at right.

As for the hardware, FIGS. 4, 5, and 6 show the flash memory controller 3 and the flash memory array 4 are provided on a printed circuit board A and enclosed by a casing B. The IDE interface 1 exposes outside the casing B to ease engaging job.

Referring to FIG. 4, IDE interface 1 has the same orientation as the casing B such that the IDE interface 1 can vertically engage with a disk connecting interface on the computer to save a horizontal space as the way has been mentioned above does. If the IDE interface of forty pins is used, the power source 2 is separate from the casing B to avoid occupying original connecting pins and provided with a power input terminal 21 and a power output terminal 22 to receive input power and send out power respectively. If the IDE interface of forty-four pins is used, the four pins therein can be utilized as power source and no additional power source 2 is necessary.

Referring to FIG. 5, the connecting interface of the hard disk is located at the left side of the main board. The IDE interface 1 is disposed vertically under both of the casing B and the circuit board A. In this way, the space along the height of the main board will not be occupied and other parts will not be affected. The power source 2 can be externally connected or not depending on the number of connecting pins on the IDE interface 1. In order to avoid an unnecessary space occupation, an end face of the IDE has an extending interface 11 with connecting pins for an external engagement. The IDE interface 1 and the extending interface 11 may engage with each other by way of pins and holes arrangement or vise versa.

Referring to FIG. 6, a further embodiment of the present invention is illustrated and it is similar to the embodiment shown in FIG. 5. The embodiment of FIG. 6 is different from that in FIG. 5 in the orientation and it is used to fit with a connecting interface of hard disk located at right side of the main board. Therefore, after engagement, the right side of the main board extends outwards such that the space along the height thereof is not occupied and it is not possible to affect the internal arrangement of the main board.

It is noted that the flash memory disk module of the present invention overcomes a restriction that the flash memory has to be actuated by way of the ISA interface standard. Furthermore, comparing the hard disk, the flash memory disk module provides a more superior feature of decay resistance, has a smaller dimension, saves much more power, offers saved data in a state of permanent storage, is a more appropriate data storage device for requiring carrying data at hand, and is compatible with the disk connecting interface on any personal computer. Therefore, it is appreciated that the flash memory disk module of the present invention is a great innovation regarding the data saving absolutely.

While the invention has been described with reference to preferred embodiments thereof, it is to be understood that modifications or variations may be easily made without departing from the spirit of this invention, which is defined by the appended claims.

What is claimed is:

1. A solid state disk module comprising:

a) an IDE interface located on a circuit board and connecting the disk module to a main board of a computer, the IDE interface having an extending interface;

b) a flash memory controller electrically connected to the IDE interface, and controlling data access and specifying an address for data storage;

c) a flash memory array having a plurality of flash memories, the flash memory array being connected to the flash memory controller for saving data, the flash memory controller and the flash memory array are electrically connected to the circuit board, the flash memory controller and the flash memory array are enclosed by a casing; and d) a power source having a power input terminal and a power output terminal and connected to the flash memory controller and the flash memory array to supply a working voltage, wherein the power source is integrally formed with the IDE interface as a single connector.

2. The solid state disk module according to claim 1, wherein the flash memory controller is a single chip controller.

3. The solid state disk module according to claim 1, wherein the flash memory controller is an MX9691 controller.

4. The solid state disk module according to claim 1, wherein the plurality of flash memories comprises ten flash memories divided into five groups.

5. The solid state disk module according to claim 1, wherein the IDE interface is electrically connected to the circuit board.

* * * * *